United States Patent [19]
Aoki et al.

[11] Patent Number: 5,248,909
[45] Date of Patent: Sep. 28, 1993

[54] ECL-TO-GAAS LEVEL CONVERTING CIRCUIT

[75] Inventors: Kouju Aoki, Inasawa; Hideji Sumi, Kani; Moriaki Mizuno, Nagoya; Tetsuya Aisaka, Kasugai, all of Japan

[73] Assignees: Fujitsu Limited; Fujitsu VLSI Limited, Kawasaki, Japan

[21] Appl. No.: 919,371

[22] Filed: Jul. 29, 1992

Related U.S. Application Data

[63] Continuation of Ser. No. 637,773, Jan. 7, 1991, abandoned.

[30] Foreign Application Priority Data

Jan. 9, 1990 [JP] Japan ........................... 2-1929

[51] Int. Cl.⁵ .................... H03K 19/086; H03K 5/153
[52] U.S. Cl. ..................... 307/475; 307/455; 307/491; 307/362; 307/542; 307/555
[58] Field of Search .............. 307/443, 455, 475, 491, 307/362, 542, 555

[56] References Cited

U.S. PATENT DOCUMENTS

| | | | |
|---|---|---|---|
| 3,590,274 | 6/1971 | Marley | 307/215 |
| 3,974,402 | 8/1976 | Fett et al. | 307/264 |
| 4,590,274 | 7/1969 | Marley | 307/215 |
| 4,849,659 | 7/1989 | West | 307/475 |
| 4,883,990 | 11/1989 | Umeki | 307/475 |
| 4,945,265 | 7/1990 | Estrada | 307/475 |
| 4,980,582 | 12/1990 | Waller et al. | 307/475 |

FOREIGN PATENT DOCUMENTS 62-318936 6/1989 Japan .
1161918 9/1989 Japan .

OTHER PUBLICATIONS

"Fully ECL-Compatible GaAs Standard-Cell Library" Shou et al., IEEE Journal of Solid-State Circuits 23 (1988) Jun., No. 3, N.Y., N.Y., pp. 676-680.

Schou et al., I.E.E.E. Journal of Solid-State Circuits, Fully ECL-Compatible, GaAs Standard-Cell Library, vol. 23, No. 3, pp. 676-680, New York, NY, US.

Primary Examiner—Margaret R. Wambach
Attorney, Agent, or Firm—Staas & Halsey

[57] ABSTRACT

A level converting circuit converts a first signal which has an ECL level which is used in an ECL device into a second signal which has a GaAs logic level which is used in a GaAs device which is based on a GaAs substrate.

15 Claims, 5 Drawing Sheets

FIG. I PRIOR ART

ECL-TO-GAAS LEVEL CONVERTING CIRCUIT

This application is continuation, of application No. 07/637,773, filed Jan. 7, 1991, now abandoned.

BACKGROUND OF THE INVENTION

The present invention generally relates to level converting circuits, and more particularly to a level converting circuit which converts an ECL level which is used in an ECL circuit into a GaAs logic level which is used in a GaAs integrated circuit using a GaAs substrate.

In the field of compound semiconductor devices, there is a strong demand to realize an integrated circuit which uses a GaAs substrate and has a large integration density. However, it is difficult at the present to form a system solely of GaAs integrated circuits (or GaAs devices). For this reason, a system is formed by using GaAs devices together with ECL circuits or the like which operate at a high speed. In this case, it is necessary to provide in the system a level converting circuit for converting the ECL level which is used in the ECL circuits into the GaAs logic level which is used in the GaAs devices.

FIG. 1 shows an example of a conventional circuit arrangement for converting the ECL level into the GaAs logic level. In FIG. 1, an ECL device 1 is coupled to a GaAs device 2. The ECL device 1 includes an ECL internal gate circuit 3 and an ECL output buffer 4. On the other hand, the GaAs device 2 includes a GaAs input buffer 5 and a GaAs internal gate circuit 6. The ECL output buffer 4 is coupled to the GaAs input buffer 5. The GaAs input buffer 5 converts an output signal of the ECL output buffer 4 having the ECL level into a signal having the GaAs logic level and supplies the converted signal to the GaAs internal gate circuit 6.

FIG. 2 shows an example of the ECL output buffer 4. The ECL output buffer 4 includes transistors T1, T2, T3 and T9, and resistors R1, R2 and R3 which are connected as shown.

FIG. 3 shows an example of a buffer part of the GaAs input buffer 5. The buffer part includes transistors Tr1 through Tr4 which are connected in series between the power sources $V_{DD}$ and $V_{SS}$. The logic signal $V_{OUT}$ from the ECL output buffer 4 is applied to a terminal 50, and an output signal of the buffer part is output via a terminal 51. The level converting circuit is provided within the GaAs input buffer 5 in addition to this buffer part shown in FIG. 3.

FIG. 4 shows an example of an interface circuit for providing the interface between the ECL device 1 and the GaAs device 2 and carrying out the necessary D.C. level conversion. The interface circuit corresponds to the buffer part of the GaAs input buffer 5 and includes transistors Tr21 through Tr28 and diodes D21 and D22 which are connected as shown. $+V$ and $-V$ respectively denote positive and negative power source voltages. The logic signal $V_{OUT}$ from the ECL output buffer 4 is applied to a terminal 70 and subjected to the D.C. level conversion in the interface circuit. A converted signal is output from a terminal 71 and is supplied to the GaAs internal gate circuit 6 within the GaAs device 2.

FIG. 5 shows an example of the GaAs internal gate circuit 6. The GaAs internal gate circuit 6 includes a transistor Tr11 which is connected to the power source GND and transistors Tr12 and Tr13 which are connected in series between the power sources $V_{DD}$ and GND. The output signal of the GaAs input buffer 5 is applied to a terminal 60, and an output signal of the GaAs internal gate circuit 6 is output via a terminal 61.

The ECL device 1 uses three power source voltages, namely, power source voltages $V_{EE}$, $V_T$ and GND. $V_{EE} = -5.2$ V, $V_T = -2$ V and GND$=0$ V. On the other hand, the GaAs device 2 uses two power source voltages, namely, power source voltages $V_{DD}$ and GND. $V_{DD} = +2$ V and GND$=0$ V. Hence, as a first method of providing an interface between the ECL device 1 and the GaAs device 2, the conventional circuit arrangement adds a negative power source voltage $V_{SS}$ in the GaAs device 2.

As a second method of providing an interface between the ECL device 1 and the GaAs device 2, the power source voltage $V_{DD}$ of the GaAs device 2 is set equal to GND$=0$ V of the ECL device 1 and the power source voltage GND of the GaAs device 2 is set equal to $V_T = -2$ V of the ECL device 1.

In addition, as a third conceivable method of providing an interface between the ECL device 1 and the GaAs device 2, the power source voltage GND of the ECL device 1 is set equal to $V_{DD} = +2$ V of the GaAs device 2 and the power source voltage $V_T$ of the ECL device 1 is set equal to GND$=0$ V of the GaAs device 2.

However, when the first method is used, a total of five power sources are required even when a common power source voltage is used as the power source voltages GND of the ECL device 1 and the GaAs device 2. As a result, there are problems in that the circuit becomes complex and it is troublesome and time consuming to design the complex circuit.

When the second method is used, there are problems in that the GaAs logic level becomes heavily dependent on the power source and it becomes impossible to provide an operating margin of the level converting circuit. These problems occur because the GaAs logic level of the GaAs device 2 is dependent on the lower power source voltage GND. In other words, when the lower power source voltage GND of the GaAs device 2 is replaced by the power source voltage $V_T(=-2$ V$)$ of the ECL device 1, the lower power source voltage GND easily fluctuates since the power source voltage $V_T$ of the ECL device 1 is easily affected by the ECL device 1.

On the other hand, when the third conceivable method is used, the operating margin of the level converting circuit is improved compared to the second method. However, since the power source voltage GND of the ECL device is replaced by the power source voltage $V_{DD}(=+2$ V$)$ of the GaAs device 2, the ECL device 1 itself becomes dependent on the power source voltage $V_{DD}$ of the GaAs device 2 and a new problem is introduced in that the margin of the ECL level becomes insufficient.

Furthermore, when one of the first through third methods is used, it is necessary to provide the ECL output buffer 4 in the ECL device 1 and to provide the GaAs input buffer 5 in the GaAs device 2. For this reason, the operation speed of the circuit arrangement is slowed down by the provision of the two buffers 4 and 5, and there is a problem in that it is difficult to realize a high speed operation.

SUMMARY OF THE INVENTION

Accordingly, it is a general object of the present invention to provide a novel and useful level converting circuit in which the problems described above are eliminated.

Another and more specific object of the present invention is to provide a level converting circuit for converting a first signal which has an ECL level which is used in an ECL device into a second signal which has a GaAs logic level which is used in a GaAs device which is based on a GaAs substrate, comprising a first power source line receiving a first power source voltage which is used in the ECL device, a second power source line receiving a second power source voltage which is lower than the first power source voltage and is used in the ECL device, a third power source line receiving a third power source voltage which is higher than the first power source voltage, an ECL converting circuit, provided within the ECL device, including emitter-coupled first and second transistors, a first resistor coupled between the first power source line and a collector of the first transistor, a second resistor coupled between the third power source line and a collector of the second transistor, and a current source coupled between the second power source line and the emitters of the first and second transistors, the first transistor having a base which receives an input signal of the level converting circuit having an ECL logic level, the second transistor having a base which receives a reference signal, a clamping circuit, coupled between the first and third power source lines and to the ECL converting circuit, clamping a collector potential of one of the first and second transistors so that the collector potential does not fall below a predetermined potential, and an output buffer part, coupled between the first and third power source lines, including a third transistor having a base coupled to the collector of the one of the first and second transistors and a collector coupled to the third power source line, the third transistor having an emitter from which an output signal of the level converting circuit is output. According to the level converting circuit of the present invention, it is possible to realize a stable and high-speed level conversion and to provide a sufficient operating margin. Further, it is possible to reduce the number of power sources required when compared to the conventional level converting circuit.

Still another object of the present invention is to provide a level converting circuit for use in converting a first signal which has an ECL level which is used in an ECL device into a second signal which has a GaAs logic level which is used in a GaAs device which is based on a GaAs substrate, where the ECL device includes at least one ECL internal gate circuit and an ECL output buffer, the GaAs device includes at least one GaAs internal gate circuit, and the level converting circuit comprises a first power source line receiving a first power source voltage which is used in the ECL device, a second power source line receiving a second power source voltage which is lower than the first power source voltage and is used in the ECL device, a third power source line receiving a third power source voltage which is higher than the first power source voltage, an ECL converting circuit, provided within the ECL device, including emitter-coupled first and second transistors, a first resistor coupled between the first and third power source line and a collector of the first transistor, a second resistor coupled between the third power source line and a collector of the second transistor, and a current source coupled between the second power source line and the emitters of the first and second transistors, the first transistor having a base which receives an input signal of the level converting circuit having an ECL logic level, the second transistor having a base which receives a reference signal, a clamping circuit, coupled between the first and third power source lines and to the ECL converting circuit, clamping a collector potential of one of the first and second transistors so that the collector potential does not fall below a predetermined potential, and an output buffer part, coupled between the first and third power source lines, including a third transistor having a base coupled to the collector of the one of the first and second transistors and a collector coupled to the third power source line, the third transistor having an emitter from which an output signal of the level converting circuit is output, where the level converting circuit is provided within the ECL output buffer. According to the level converting circuit of the present invention, it is possible to ensure a high-speed level conversion because the level converting circuit is provided within the ECL output buffer and no GaAs input buffer is required in the GaAs device.

Other objects and further features of the present invention will be apparent from the following detailed description when read in conjunction with the accompanying drawings.

DESCRIPTION OF THE PREFERRED EMBODIMENTS

Figure 2:
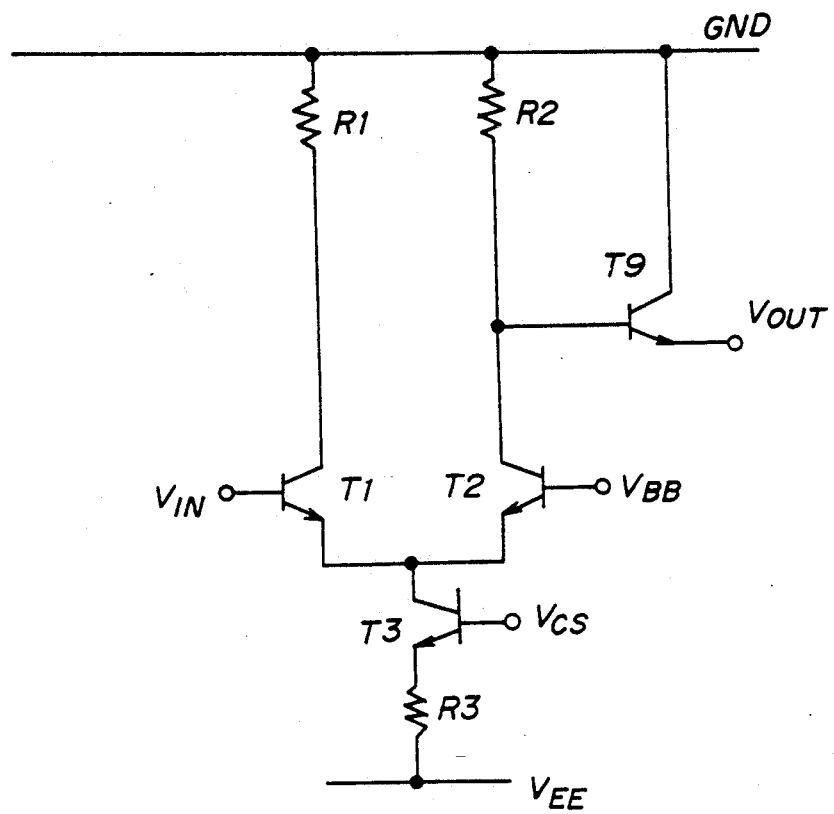
FIG. 2 is a circuit diagram showing an example of an ECL output buffer shown in FIG. 1.
Figure 3:
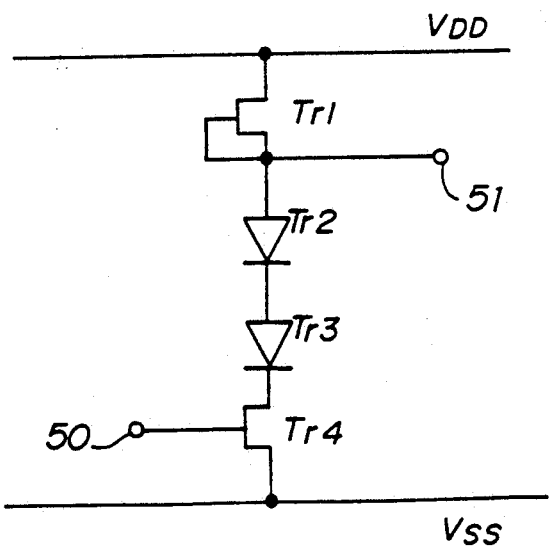
FIG. 3 is a circuit diagram showing an example of a GaAs input buffer shown in FIG. 1.
Figure 4:
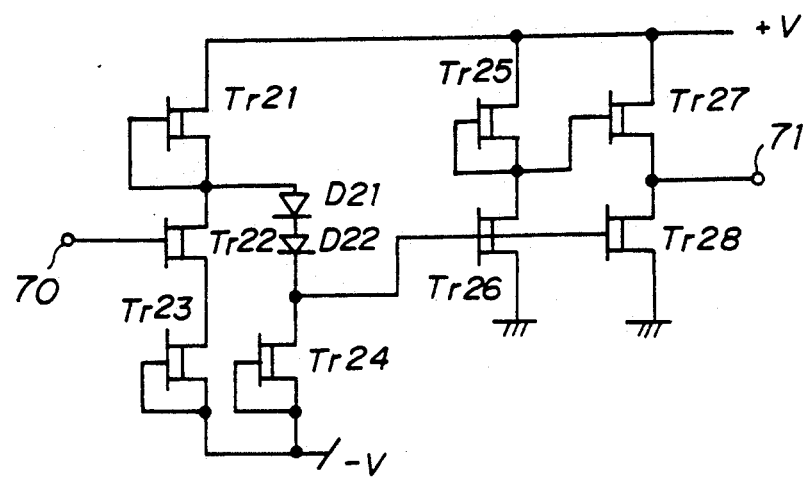
FIG. 4 is a circuit diagram showing an example of an interface circuit for providing an interface between an ECL device and a GaAs device shown in FIG. 1.
Figure 6:
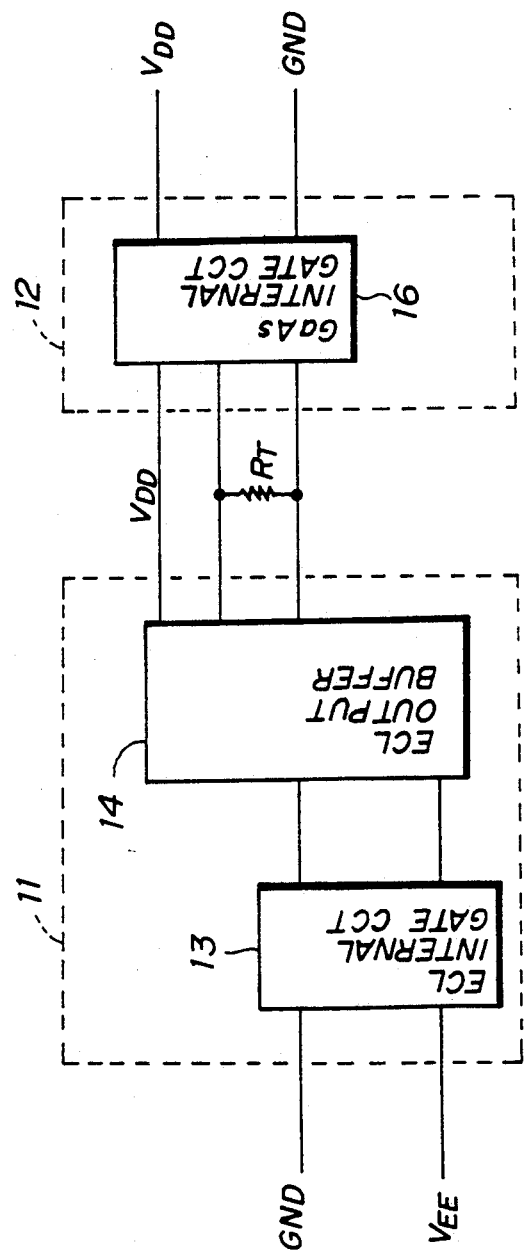
FIG. 6 is a system block diagram showing a circuit arrangement to which an embodiment of a level converting circuit according to the present invention may be applied.

FIG. 6 shows a circuit arrangement to which an embodiment of a level converting circuit according to the present invention may be applied. In FIG. 6, those parts which are the same as those corresponding parts in FIG. 2 are designated by the same reference numerals. In FIG. 6, an ECL device 11 is coupled to a GaAs device 12. The ECL device 11 includes at least one ECL internal gate circuit 13 and an ECL output buffer 14. On the other hand, the GaAs device 12 includes a GaAs input buffer 15 and a GaAs internal gate circuit 16. The ECL output buffer 14 is coupled to the GaAs input buffer 15. The ECL output buffer circuit 14 converts an output signal of the ECL internal gate circuit 13 having the ECL level into a signal having the GaAs logic level and supplies the converted signal to the GaAs input buffer 15.

Figure 1:
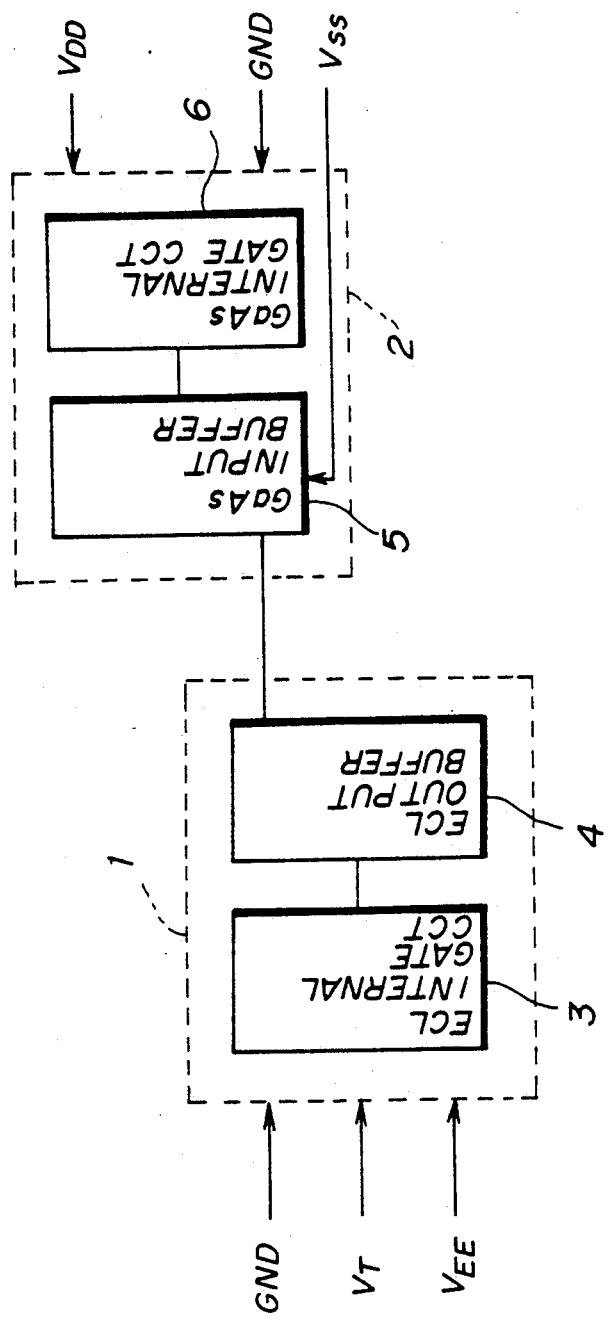
FIG. 1 is a system block diagram showing an example of a conventional circuit arrangement for converting the ECL level into the GaAs logic level.

The ECL internal gate circuit 13 corresponds to the ECL internal gate circuit 3 shown in FIG. 1, and the GaAs internal gate circuit 16 corresponds to the GaAs internal gate circuit 6 shown in FIG. 1.

The ECL device 11 uses three power source voltages, namely, power source voltages $V_{EE}$, $V_{DD}$ and GND. $V_{EE} = -5.2$ V $V_{DD} = +2$ V and GND$=0$ V. On the other hand, the GaAs device 2 uses two power source voltages, namely, power source voltages $V_{DD}$ and GND. $V_{DD} = +2$ V and GND$=0$ V. The power source voltages $V_{DD}$ and GND used in the ECL device 11 are respectively the same as the power source voltages $V_{DD}$ and GND of the GaAs device 12. There is no need to provide a power source for supplying the power source voltage $V_T$ in the ECL device 11, and there is no need to provide an additional power source for supplying the power source voltage $V_{SS}$ in the GaAs device 12. Hence, only three power sources are required in this embodiment.

Figure 7:
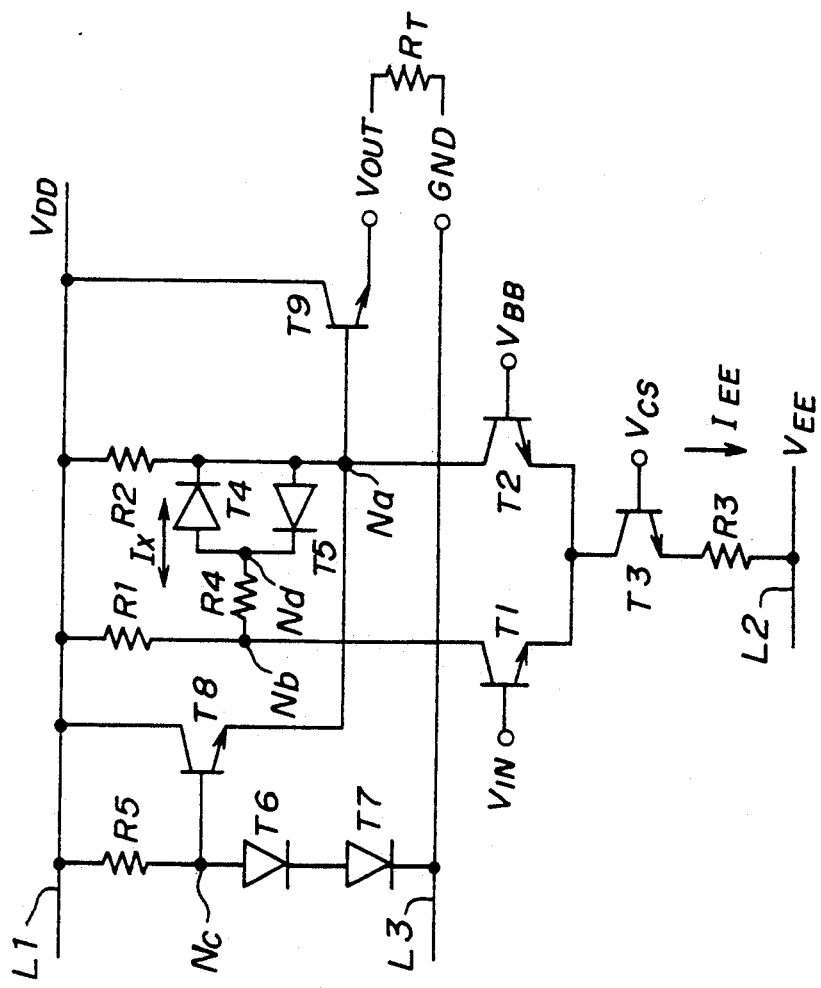
FIG. 7 is a circuit diagram showing the embodiment of the level converting circuit according to the present invention.

FIG. 7 shows the embodiment of the level converting circuit according to the present invention. This level converting circuit is provided within the ECL output buffer 14 shown in FIG. 6 on a Si substrate of the ECL device 11.

A collector of a transistor T1 is coupled to a line L1 via a resistor R1, and a collector of a transistor T2 is coupled to the line via a resistor R2. Emitters of the transistors T1 and T2 are coupled to a common current source having a known structure. The current source includes a transistor T3, a resistor R3 and the like. A logic signal $V_{IN}$ which has the ECL level and is obtained from the ECL internal gate circuit 13 is applied to a base of the transistor T1. On the other hand, a reference voltage $V_{BB}$ is applied to a base of the transistor T2. For example, the reference voltage $V_{BB} = -1.3$ V. A voltage $V_{CS}$ is applied to a base of the transistor T3. For example, the voltage $V_{CS} = -3.9$ V.

The line L1 is provided only with respect to the level converting circuit and is applied with a power source voltage $V_{DD} = +2$ V. Accordingly, the power source voltage $V_{DD}$ will not be supplied to the ECL internal gate circuit 13 within the ECL device 11. In addition, a line L2 is applied with a power source voltage $V_{EE} = -5.2$ V. This power source voltage $V_{EE}$ is supplied to each ECL internal gate circuit 13 of the ECL device 11.

A resistor R4 and diodes T4 and T5 form a temperature coefficient adjusting circuit. This temperature coefficient adjusting circuit is connected between a node Nb which connects the collector of the transistor T1 to the resistor R1 and a node Na which connects the collector of the transistor T2 to the resistor R2.

A base of a transistor T9 is connected to the collector of the transistor T2, and a collector of the transistor T9 is connected to the line L1. The transistor T9 has an open emitter which is coupled to an external output terminal of the ECL device 11. An external terminator resistor $R_T$ is connected between the external output terminal and a grounding external terminal GND ($=0$ V).

A resistor R5 and diodes T6 and T7 are connected in series between the lines L1 and L3. A base of a transistor T8 is connected to a node Nc between the resistor R5 and the diode T6. The transistor T8 forms a clamping circuit together with the resistor R5 and the diodes T6 and T7. A collector of the transistor T8 is connected to the line L1, while emitter of the transistor T8 is connected to the collector of the transistor T2.

The diodes T4 through T7 are made up of the same type of transistors used for the transistors T1 through T3, T8 and T9. In other words, the transistor which is formed on the Si substrate has the base and collector thereof connected so as to form the diode. In addition, the line L3 is used in common with each ECL internal gate circuit 13 within the ECL device 11, and one end of the line L3 is connected to the external grounding terminal GND.

Next, a description will be given of the operation of the level converting circuit having the structure described above. [1 When the ECL level of the logic signal $V_{IN}$ which is obtained from the ECL internal gate circuit 13 and applied to the base of the transistor T1 is lower than the reference volta $V_{BB}$ which is applied to the base of the transistor T2, the transistor T2 turns ON and a voltage drop across the resistor R2 increases. A potential at the node Na falls and cuts OFF the transistor T9. In this state, a base potential of the transistor T9 is clamped to a potential (base-emitter voltage) corresponding to one transistor from the potential (GND$=0$ V) of the line L3 by the clamping circuit. Hence, the external output terminal is clamped to the potential GND ($=0$ V). In this case, the level converting circuit outputs a logic signal $V_{OUT}$ having a low GaAs logic level in response to the logic signal $V_{IN}$ having a low ECL level.

On the other hand, when the logic signal $V_{IN}$ applied to the base of the transistor T1 is higher than the reference voltage $V_{BB}$ applied to the base of the transistor T2, the transistor T1 turns ON and the transistor T2 turns OFF. As a result, the potential (base voltage) at the node Na rises and turns ON the transistor T9. In other words, the base voltage of the transistor T9 in this state becomes a potential which is the voltage drop across the resistor R2 lower than the power source voltage $V_{DD}$, and the voltage at the external output terminal is the base-emitter voltage of the transistor T9 lower than this potential. In this case, the level converting circuit outputs a logic signal $V_{OUT}$ having a high GaAs logic level in response to the logic signal $V_{IN}$ having a high ECL level.

Accordingly, the level converting circuit converts the logic signal $V_{IN}$ having the ECL level into the logic signal $V_{OUT}$ having the GaAs logic level. In addition, since the level conversion is carried out within the ECL device 11, there is no need to provide a GaAs input buffer 15 within the GaAs device 12 for carrying out the level conversion and the level conversion can be carried out within the ECL device 11 at a high speed.

In FIG. 7, the circuit constants are set as follows, for example. R1$=$R2$=0.525$ k$\Omega$, R3$=0.08$ k$\Omega$, R4$=0.48$ k$\Omega$ and R5$=0.64$ k$\Omega$. In this case, a current $I_{EE}$ which flows through the resistor R3 is 5 mA. For example, $R_T = 50$ $\Omega$.

In the level converting circuit, a power source for supplying the power source voltage $V_{DD}$ is provided as a third power source. However, this third power source is used only in the level converting circuit and is not used in the ECL internal gate circuits 13 within the ECL device 11. For this reason, the ECL level of the logic signals formed in the ECL internal gate circuits 13 is stable and has a sufficient margin. In addition, although the temperature characteristics of the ECL device 11 and the GaAs device 12 differ, the level fluctuation caused by a temperature change is suppressed to an extremely small value by the provision of the temperature coefficient adjusting circuit, thereby ensuring a stable level conversion.

Next, a description will be given of the operation of the temperature coefficient adjusting circuit which is made up of the resistor R4 and the diodes T4 and T5.

When the logic signal $V_{IN}$ has the high level, a current flows through a path which includes the resistor R1, the transistors T1 and T3 and the resistor R3, and a current flows through another path which includes the resistor R2, the diode T5, the resistor R4, the transistors T1 and T3 and the resistor R3. As the temperature rises, a base-emitter voltage $V_{BE3}$ of the transistor T3 decreases and the current $I_{EE}$ increases. On the other hand, a base-emitter voltage $V_{BE5}$ of the diode T5 decreases and a potential difference across the nodes Nb and Nd increases. Due to the increasing current $I_{EE}$ and the increasing potential difference across the nodes Nb and Nd, a current $I_X$ increases and the potential at the node Na falls. When the potential at the node Na falls, the signal level of the logic signal $V_{OUT}$ which corresponds to the high GaAs logic level tends to fall. On the other hand, when the temperature rises, a base-emitter volta $V_{BE9}$ of the transistor T9 decreases and the signal level of the logic signal $V_{OUT}$ which corresponds to the high GaAs logic level tends to rise. Hence, the falling tendency of the high signal level of the logic signal $V_{OUT}$ and the rising tendency of the high signal level of the logic signal $V_{OUT}$ cancel each other.

On the other hand, when the logic signal $V_{IN}$ has the low level, a current flows through a path which includes the resistor R2, the transistors T2 and T3 and the resistor R3, and a current flows through another path which includes the resistor R1, the resistor R4, the diode T4, the transistors T2 and T3 and the resistor R3. As the temperature rises, the base-emitter voltage $V_{BE3}$ of the transistor T3 decreases and the current $I_{EE}$ increases. As a result, a voltage drop across the resistor R2 increases, the signal level of the logic signal $V_{OUT}$ which corresponds to the low GaAs logic level tends to fall. On the other hand, the base-emitter voltage $V_{BE9}$ of the diode T9 decreases and the signal level of the logic signal $V_{OUT}$ which corresponds to the low GaAs logic level tends to rise. Furthermore, when the temperature rises, the base-emitter volta $V_{BE4}$ of the diode T4 decreases, the potential difference across the ground GND and the node Nd increases, the current $I_X$ increases and the voltage across the resistor R2 decreases. Hence, the signal level of the logic signal $V_{OUT}$ which corresponds to the low GaAs logic level tends to rise. Therefore, the falling tendency of the low signal level of the logic signal $V_{OUT}$ and the rising tendencies of the low signal level of the logic signal $V_{OUT}$ cancel each other.

For the foregoing reasons, the level fluctuation caused by a temperature change is suppressed to an extremely small value by the provision of the temperature coefficient adjusting circuit, thereby ensuring a stable level conversion.

When supplying the logic signal $V_{OUT}$ from the ECL output buffer 14 of the ECL device 11 to the GaAs input buffer 15 of the GaAs device 12, it is desirable to carry out a D.C. level conversion. In other words, it is desirable to convert the small amplitude signal from the ECL device 11 into a large amplitude signal for use within the GaAs device 12.

Figure 8:
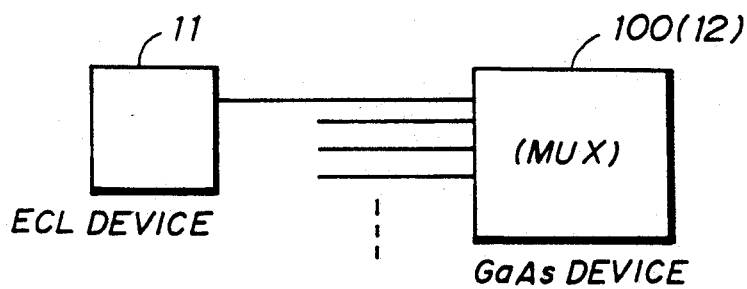
FIG. 8 is a system block diagram for explaining an application of the level converting circuit according to the present invention.
Figure 5:
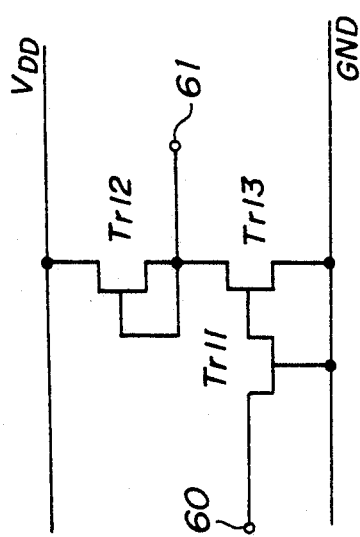
FIG. 5 is a circuit diagram showing an example of a GaAs internal gate circuit shown in FIG. 1.

The level conversion circuit according to the present invention is suited for use in various applications including a case where the ECL device 11 is coupled to a multiplexer, adder or the like within the GaAs device 12 and supplies data to such devices. FIG. 8 shows one application where the ECL device 11 supplies 8-bit data to an 8:1 multiplexer 100 within the GaAs device 12. Such a multiplexer 100 is often used in testing and measuring instruments.

Further, the present invention is not limited to these embodiments, but various variations and modifications may be made without departing from the scope of the present invention.

What is claimed is:

1. An apparatus for converting a first signal used in an ECL device into a second signal which has a GaAs logic level which is used in a GaAs device, using a reference signal, said apparatus comprising:
a first power source line receiving a first power source voltage which is used in the ECL device;
a second power source line receiving a second power source voltage which is lower than the first power source voltage and is used in the ECL device;
a third power source line receiving a third power source voltage which is higher than the first power source voltage;
a level converting circuit, provided within the ECL device, including emitter-coupled first and second transistors, a first resistor coupled to said third power source line and a collector of the first transistor, a second resistor coupled between said third power source line and a collector of the second transistor, and a current source coupled between said second power source line and coupled emitters of the first and second transistors, a base of said first transistor receiving one of the first signal and the reference signal, and a base of said second transistor receiving the other of the first signal and the reference signal;
an output buffer part, coupled between said first and third power source lines, including a third transistor having a base coupled to the collector of said one of the first and second transistors and a collector coupled to said third power source line, said third transistor having an emitter from which the second signal is output; and
a clamping circuit, coupled between said first and third power source lines, to said level converting circuit, and to the base of the third transistor, for clamping a collector potential of one of the first and second transistors so that the collector potential does not fall below a predetermined potential, and for clamping an emitter potential of the third transistor to a level substantially identical to the first power source voltage when the second signal has a low logic level, said second signal operating in a voltage range between said first and third power source voltages.

2. The apparatus as claimed in claim 1, wherein said clamping circuit includes a fourth transistor having a collector coupled to said third power source line and an emitter coupled to the collector of said one of the first and second transistors, a third resistor coupled between said third power source line and a base of said fourth transistor, and diode means coupled between the base of said fourth transistor and said first power source line.

3. The apparatus as claimed in claim 2, wherein said one of the first and second transistors is the second transistor.

4. The apparatus as claimed in claim 1, wherein an external terminator resistor is coupled across the emitter of said third transistor and said first power source line.

5. The apparatus as claimed in claim 1, wherein said first power source voltage is a ground voltage, said second power source voltage is a negative voltage, and said third power source voltage is positive voltage.

6. The apparatus as claimed in claim 1, wherein said first and third power source voltage respectively are identical to power source voltages used in the GaAs device.

7. The apparatus as claimed in claim 1, wherein said apparatus is provided within the ECL device.

8. The apparatus as claimed in claim 1, further comprising:
a temperature coefficient adjusting circuit coupled between a first node which connects the collector of the first transistor and the first resistor and a second node which connects the collector of the second transistor and the second resistor, said temperature coefficient adjusting circuit suppressing a level fluctuation within the level converting circuit caused by different temperature characteristics of the ECL device and the GaAs device.

9. The apparatus as claimed in claim 8, wherein said temperature adjusting circuit includes a diode circuit made up of first and second diodes which are coupled in parallel in mutually opposite bias directions, and a third resistor coupled in series to said diode circuit.

10. The apparatus as claimed in claim 1, wherein the ECL device includes at least one ECL internal gate circuit and an ECL output buffer which is coupled to said ECL internal gate circuit, said ECL output buffer including the level converting circuit.

11. The apparatus as claimed in claim 1, wherein said clamping circuit includes a fourth transistor having a collector coupled to said third power source line and an emitter coupled to the collector of said one of the first and second transistors, a third resistor coupled between said third power source line and a base of said fourth transistor, and diode means coupled between the base of said fourth transistor and said first power source line, and the level converting circuit further comprises a temperature coefficient adjusting circuit coupled between a first node which connects the collector of the first transistor and the first resistor and a second node which connects the collector of the second transistor and the second resistor, said temperature coefficient adjusting circuit suppressing a level fluctuation within the level converting circuit caused by different temperature characteristics of the ECL device and the GaAs device.

12. The apparatus as claimed in claim 11, wherein said temperature adjusting circuit includes a diode circuit made up of first and second diodes which are coupled in parallel in mutually opposite bias directions, and a fourth resistor coupled in series to said diode circuit.

13. The apparatus for converting a first signal into a second signal of a different logic type than the first signal using a reference signal, said apparatus receiving at least first and second power supply signals, said apparatus comprising:
a first transistor having a base coupled to receive the first signal;
a second transistor having an emitter coupled to an emitter of said first transistor, and having a base coupled to receive the reference signal;
a current source coupled to the emitters of the first and second transistors;
a first resistor having a first end coupled to a collector of the transistor, and having a second end coupled to receive the first power supply signal;
a second resistor having a first end coupled to a collector of the second transistor, and having a second end coupled to receive the first power supply signal;
a clamping circuit including
a third resistor having a first end coupled to receive the first power supply signal,
a first diode having an anode coupled to a second end of the third resistor,
a second diode having an anode coupled to a cathode of the first diode, and having a cathode coupled to receive the second power supply signal, and
a third transistor having a base coupled to a second end of the third resistor, having a collector coupled to receive the first power supply signal, and having an emitter coupled to the collector of the second transistor; and
a fourth transistor having a collector coupled to receive the first power supply signal, having a base coupled to the collector of the second transistor so that a voltage level at the emitter of the third transistor is equal to a voltage level at the base of the fourth transistor and having an emitter for outputting the second signal which operates in a voltage range between a voltage level of the first power supply signal and a voltage level of the second power supply signal,
the clamping circuit causing a potential at the emitter of the fourth transistor to be substantially identical to a voltage level of the second power supply signal when the second signal is at a low voltage level.

14. The apparatus as claimed in claim 13, further comprising:
a fourth resistor having a first end coupled to one of the collectors of the first and second transistors;
a third diode having an anode coupled to a second end of the fourth resistor, and a cathode coupled to the other of the collectors of the first and second transistors; and
a fourth diode having a cathode coupled to the second end of the fourth resistor, and an anode coupled to the other of the collectors of the first and second transistors.

15. The apparatus as claimed in claim 13, wherein the first and second signals have ECL and GaAs logic levels, respectively.

* * * * *

UNITED STATES PATENT AND TRADEMARK OFFICE
CERTIFICATE OF CORRECTION

PATENT NO. : 5,248,909
DATED : Sep. 28, 1993
INVENTOR(S) : AOKI et al.

It is certified that error appears in the above-indentified patent and that said Letters Patent is hereby corrected as shown below:

TITLE PAGE: [54] Change "ECL-TO-GAAS" to --ECL-TO-GaAs--;

[56] References Cited, under U.S. PATENT DOCUMENTS, second column, delete "4,590,274  7/1969  Marley .............. 307/215".

Col. 1, line 1, change "ECL-TO-GAAS" to --ECL-TO-GaAs--;
line 4, after "is" insert --a--.

Col. 5, line 12, after "5.2V" insert --,--.

Col. 6, line 17, delete "[1"; and start a new paragraph with "When".

Signed and Sealed this

Thirty-first Day of December, 1996

Attest:

BRUCE LEHMAN

Attesting Officer                Commissioner of Patents and Trademarks

UNITED STATES PATENT AND TRADEMARK OFFICE
CERTIFICATE OF CORRECTION

PATENT NO. : 5,248,909
DATED : September 28, 1993
INVENTOR(S) : AOKI et al.

It is certified that error appears in the above-indentified patent and that said Letters Patent is hereby corrected as shown below:

TITLE PAGE: [73] Assignee: Change the Assignee information to read:

Fujitsu Limited, Kawasaki; Fujitsu VLSI Limited, Kasugai, both of Japan

Signed and Sealed this

Twenty-sixth Day of August, 1997

Attest:

BRUCE LEHMAN

*Attesting Officer*  *Commissioner of Patents and Trademarks*